(12) United States Patent
Ni et al.

(10) Patent No.: US 9,642,269 B2
(45) Date of Patent: May 2, 2017

(54) REPLACEABLE PANEL STRUCTURE AND PANEL REPLACEABLE MOISTURE SENSOR, SOCKET, AND SWITCH

(71) Applicant: Wenzhou MTLC Electric Co., Ltd, Yueqing (CN)

(72) Inventors: Lidong Ni, Yueqing (CN); Wei Gao, Yueqing (CN)

(73) Assignee: Wenzhou MTLC Electric Co., Ltd, Yueqing, Zhejiang (CN)

(*) Notice: Subject to any disclaimer, the term of this patent is extended or adjusted under 35 U.S.C. 154(b) by 27 days.

(21) Appl. No.: 14/952,407

(22) Filed: Nov. 25, 2015

(65) Prior Publication Data

US 2017/0020009 A1    Jan. 19, 2017

(30) Foreign Application Priority Data

Jul. 16, 2015    (CN) .......................... 2015 1 0419711

(51) Int. Cl.
*H05K 5/00*    (2006.01)
*H05K 5/02*    (2006.01)

(52) U.S. Cl.
CPC ........... *H05K 5/0217* (2013.01); *H05K 5/026* (2013.01)

(58) Field of Classification Search
CPC .............................. H05K 5/0217; H05K 5/026

USPC ........................................................... 174/50
See application file for complete search history.

(56) References Cited

U.S. PATENT DOCUMENTS

| 7,946,091 B1* | 5/2011 | Wisniewski | ........... H02G 3/123 |
| | | | 174/53 |
| 2009/0283291 A1* | 11/2009 | Ni | ....................... H01R 13/5213 |
| | | | 174/67 |

* cited by examiner

*Primary Examiner* — Sherman Ng
(74) *Attorney, Agent, or Firm* — Ziegler IP Law Group, LLC

(57) ABSTRACT

A replaceable panel structure and a panel replaceable moisture sensor, socket, and switch having the replaceable panel structure. The replaceable panel structure includes a base, and a panel body mounted on the base by using several snap structures. The snap structure comprising a slide slot and an engagement portion disposed on the base or the panel body, and a slide fastener disposed on the panel body or the base, the slide fastener is suitable to be inserted in the slide slot and slide back and forth in the slide slot to be engaged with or separated from the engagement portion, and the slide fasteners of the snap structures have consistent sliding directions in the slide slot. The replaceable panel structure replaces the panel and the base in a sliding manner, and has advantages of a simple structure, convenient removal, and stable engagement.

12 Claims, 5 Drawing Sheets

REPLACEABLE PANEL STRUCTURE AND PANEL REPLACEABLE MOISTURE SENSOR, SOCKET, AND SWITCH

FIELD

The aspects of the disclosed embodiments relate to the field of electrical components, and in particular, to a replaceable panel structure and a panel replaceable socket, a switch, and moisture sensor.

BACKGROUND

When an electrical component such as a moisture sensor, a socket and a switch is used, a matching degree between colors of a panel thereon and the surrounding environment is generally taken into consideration, so as to achieve an aesthetically pleasing effect in relation to the surrounding environment. A panel of a conventional electrical component is generally integrated with a body of the electrical component and is irreplaceable; therefore, when the color of the panel does not match with the surrounding environment, the whole electrical component needs to be replaced. Moreover, when the panel of the electrical component such as the socket, the switch and the moisture sensor is damaged, the whole electrical component needs to be replaced, which causes a waste of cost.

A typical panel replaceable wall-type switch socket is formed by a switch component, a fixing base plate, a slot, a fastener, a switch socket, a positioning hook, a decoration panel, and a hollow cylindrical object. The hollow cylindrical object is disposed between the switch component and the switch socket. One or more positioning hooks protruding outward are disposed at one end of the hollow cylindrical object near the fixing base plate. A slot recessing inward is disposed on an inner wall of the decoration panel, and the decoration panel is horizontally fixed by engaging the slot with the positioning hook on the hollow cylindrical object. The other end of the hollow cylindrical object is provided with two or more slots recessing inward. A small opening is provided in the middle of the decoration panel, the small opening being provided with snaps matching with the slots, and the switch component is integrated with the decoration panel and the switch socket by snapping two ends of the snap into the slot for fixation.

This wall-type switch socket can implement the replacement of the panel; however, the removal of the snap is implemented by pressing the two hook-shaped ends of the snap that are snapped into the slot inward and then pulling them outward. Therefore, elastic deformation of the snap is used, and in order to make the snap have elasticity, the snap is generally made into a thin frame structure; however, the snap is easily damaged due to a large force during removal and replacement. If the force is not large enough, the tow hook-shaped ends of the snap are not easily separated from the slot, and if they are separated forcibly, a problem that the hook-shaped portion is easily damaged will occur.

Accordingly, it would be desirable to provide a replaceable panel structure and a panel replaceable socket, switch, and moisture sensor that addresses at least some of the problems identified above.

SUMMARY

Therefore, a technical problem to be solved by the aspects of the disclosed embodiments lies in that an existing replaceable panel easily causes damage of a snap during removal for replacement, so that it is inconvenient for removal. As a result, a replaceable panel structure and a panel replaceable socket, switch, and moisture sensor that are simple in structure, convenient in removal, and stable in engagement are provided.

To solve the above technical problem, a replaceable panel structure of the disclosed embodiments comprises a base, and a panel body mounted on the base by using several snap structures in a replaceable manner, wherein: the snap structure comprises a slide slot and an engagement portion disposed on the base or the panel body, and a slide fastener disposed on the panel body or the base, the slide fastener is suitable to be inserted in the slide slot and slide back and forth in the slide slot to be engaged with or separated from the engagement portion, and the slide fasteners of the snap structures have consistent sliding directions in the slide slot.

The slide slot is a through slot formed on the base or the panel body; and one end portion of the slide slot forms the engagement portion; and the slide fastener comprises a longitudinal block and a horizontal block, one end of the longitudinal block is disposed on the panel body or the base, and the other end is connected to one end of the horizontal block; the longitudinal block, the horizontal block and the panel body or the base enclose an embedding slot, and when the slide fastener moves toward an engagement direction, the embedding slot is suitable for embedding of the engagement portion.

The slide slot is formed into a linear shape, a length direction of the horizontal block of the slide fastener is consistent with a length direction of the slide slot, and the engagement portion is formed at one end portion of the slide slot facing the embedding slot.

An upper surface of the horizontal block and a lower surface of the engagement portion form matching wedge surfaces.

The slide slot is formed into an L shape, and comprises a vertical slot portion and a horizontal slot portion, the slide fastener moves back and forth along the vertical slot portion, a length direction of the horizontal block of the slide fastener is consistent with a length direction of the horizontal slot portion of the slide slot, and the engagement portion is formed at one end portion of the vertical slot portion facing the embedding slot.

The upper surface of the horizontal block forms a convex cambered surface, and the lower surface of the engagement portion forms a matching concave cambered surface.

The snap structures comprise a first snap structure and a second snap structure, wherein a first slide slot of the first snap structure is formed into a linear shape, a first slide fastener comprises a first horizontal block and a first longitudinal block, a length direction of the first horizontal block is consistent with a length direction of the first slide slot, and a first engagement portion is formed at one end portion of the first slide slot facing the first embedding slot; a second slide slot of the second snap structure is formed into an L shape, and comprises a second horizontal slot portion and a second vertical slot portion, wherein a second slide fastener moves back and forth along the second vertical slot portion, the second slide fastener comprises a second horizontal block and a second longitudinal block, a length direction of the second horizontal block is consistent with a length direction of the second horizontal slot portion of the second slide slot, a second engagement portion is formed at one end portion of the second vertical slot portion facing the second embedding slot, and a length direction of the second engagement portion is perpendicular to the length direction of the second horizontal slot portion.

An upper surface of the first horizontal block and a lower surface of the first engagement portion form matching wedge surfaces; an upper surface the second horizontal block forms a convex cambered surface, and a lower surface of the second engagement portion forms a matching concave cambered surface.

Two first snap structures are provided, and two second snap structures are provided, which are respectively disposed at two ends of the panel body or the base.

A panel replaceable switch of the disclosed embodiments comprises the above replaceable panel structure, wherein the panel body is provided with a switch button.

A panel replaceable socket of the disclosed embodiments comprises the above replaceable panel structure, wherein the panel body is provided with a jack.

A panel replaceable moisture sensor of the disclosed embodiments comprises the above replaceable panel structure, wherein the panel body is provided with a function button of a sensor.

The above technical solution has the following advantages compared with the prior art:

(1) The replaceable panel structure of the disclosed embodiments comprises a base, and a panel body mounted on the base by using several snap structures in a replaceable manner, wherein: the snap structure comprises a slide slot and an engagement portion disposed on the base or the panel body, and a slide fastener disposed on the panel body or the base, the slide fastener is suitable to be inserted in the slide slot and slide back and forth in the slide slot to be engaged with or separated from the engagement portion, and the slide fasteners of the snap structures have consistent sliding directions in the slide slot. The replaceable panel structure of the disclosed embodiments not only has a simple structure, but also can implement replacement of the panel through sliding of the slide fastener along a direction perpendicular to an engagement direction of the panel and the base, so that the engagement of the panel and the base of the electrical component is stable, the removing process during the replacement is simple and convenient, and no damage is easily caused after multiple removals.

(2) In the replaceable panel structure of the disclosed embodiments, the snap structures comprise a first snap structure and a second snap structure, wherein a first slide slot of the first snap structure is formed into a linear shape, a first slide fastener comprises a first horizontal block and a first longitudinal block, a length direction of the first horizontal block is consistent with a length direction of the first slide slot, and a first engagement portion is formed at one end portion of the first slide slot facing the first embedding slot; a second slide slot of the second snap structure is formed into an L shape, and comprises a second horizontal slot portion and a second vertical slot portion, wherein a second slide fastener moves back and forth along the second vertical slot portion, the second slide fastener comprises a second horizontal block and a second longitudinal block, a length direction of the second horizontal block is consistent with a length direction of the second horizontal slot portion of the second slide slot, a second engagement portion is formed at one end portion of the second vertical slot portion facing the second embedding slot, and a length direction of the second engagement portion is perpendicular to the length direction of the second horizontal slot portion. The dispositions of the first snap structure and the second snap structure enable that the panel body and the base are engaged in both the vertical and horizontal directions, so that the engagement is more stable and reliable.

(3) In the replaceable panel structure of the disclosed embodiments, an upper surface of the first horizontal block and a lower surface of the first engagement portion form matching wedge surfaces; an upper surface of the second horizontal block forms a convex cambered surface, and a lower surface of the second engagement portion forms a matching concave cambered surface. The wedge surfaces enable more convenient and more reliable engagement of the first horizontal block and the first engagement portion during mounting of the panel. The upper surface of the second horizontal block forms the convex cambered surface, and the lower surface of the second engagement portion forms the matching concave cambered surface, such that after the second horizontal block is engaged with the second engagement portion, it is not easily separated from the second engagement portion, thereby implementing more stable mounting of the panel on the base.

(4) In the replaceable panel structure of the disclosed embodiments, two first snap structures are provided, and two second snap structures are provided, which are respectively disposed at two ends of the panel body or the base. Such a disposition enables more balanced forces applied to the panel body and the base, and the replaceable panel is not easily separated after being mounted on the base, thereby having a good mounting effect.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

In order that the content of the disclosed embodiments is clearly understood more easily, the disclosed embodiments are further described in detail through specific embodiments of the disclosed embodiments and the accompanying drawings, wherein.

Figure 1:
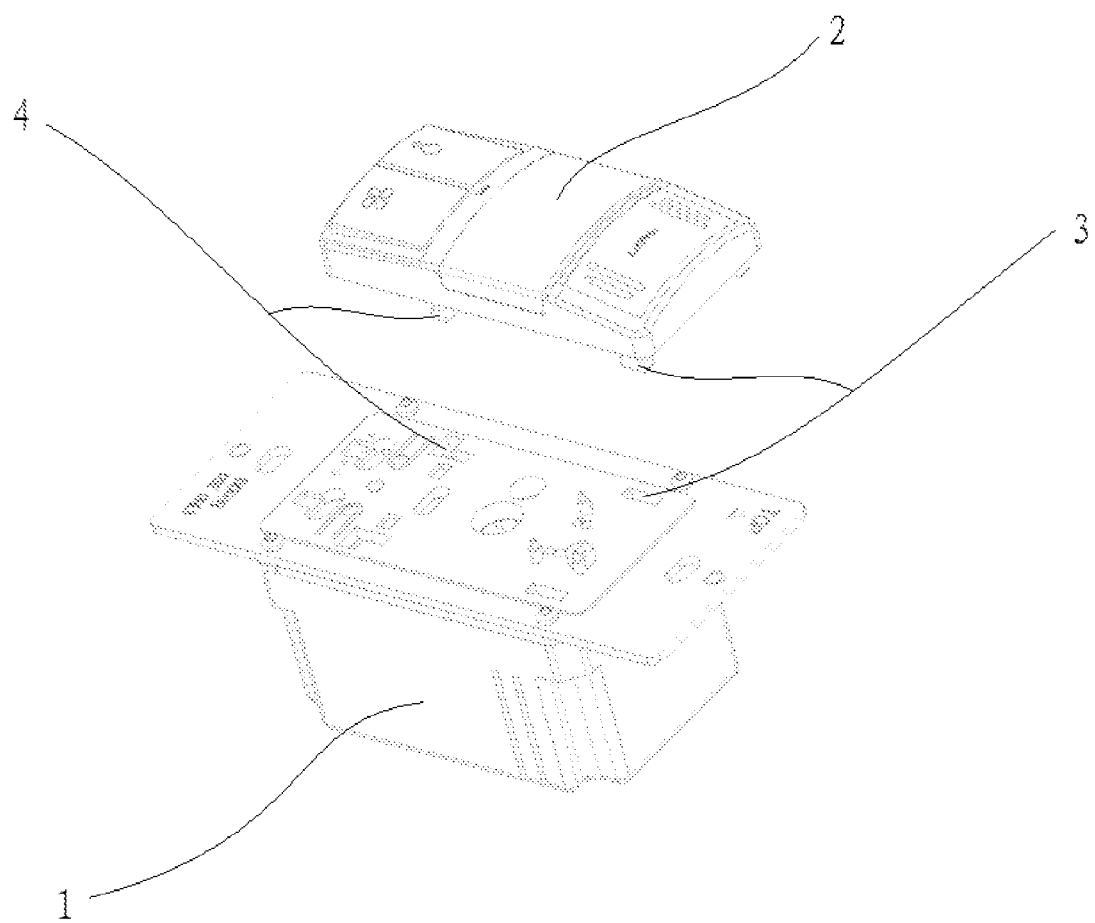
FIG. 1 is a three-dimensional diagram of a replaceable structure according to Embodiment 1 of the disclosed embodiments.

Reference numerals in the accompanying drawings are: 1—base, 2—panel body, 3—first snap structure, 31—first slide slot, 32—first slide fastener, 321—first horizontal block, 322—first longitudinal block, 33—first engagement portion, 4—second snap structure, 41—second slide slot, 411—second horizontal slot portion, 412—second vertical slot portion, 42—second slide fastener, 421—second horizontal block, 422—second longitudinal block, 43—second engagement portion, 100—first embedding slot, 200—second embedding slot, 300—moisture sensor.

DETAILED DESCRIPTION OF THE DISCLOSED EMBODIMENTS

The aspects of the disclosed embodiments are further described by using the following embodiments in combination with the accompanying drawings.

Embodiment 1

Figure 2:
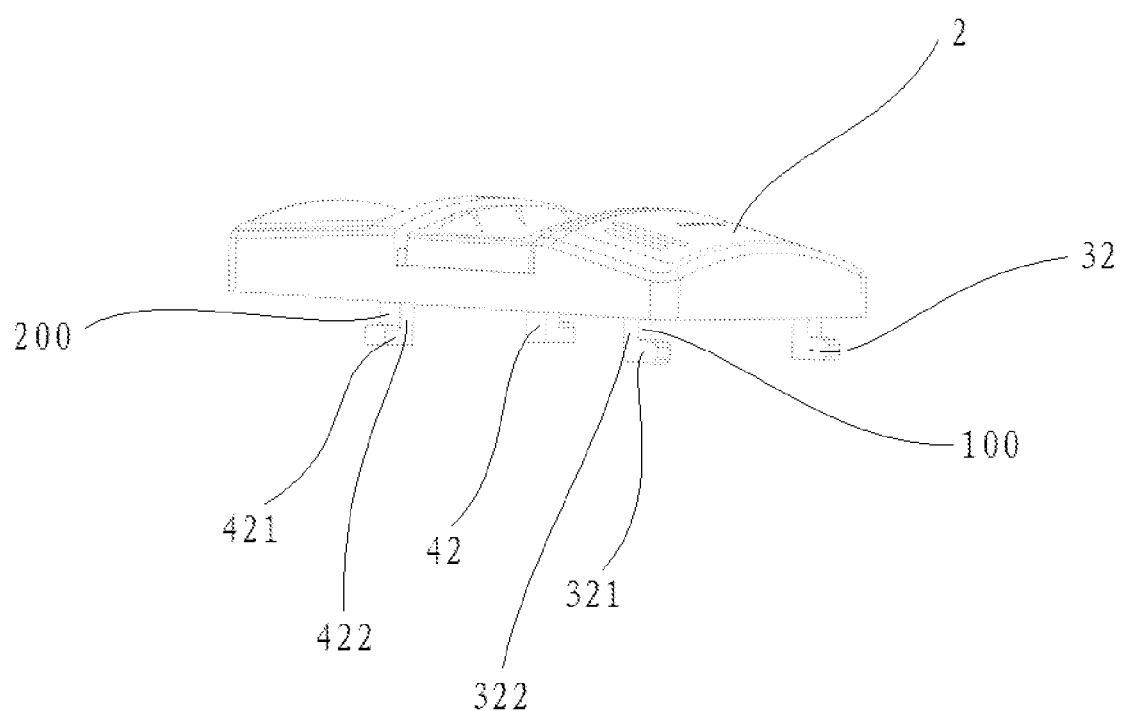
FIG. 2 is a three-dimensional diagram of a part of a replaceable structure disposed on a panel according to Embodiment 1 of the disclosed embodiments.
Figure 3:
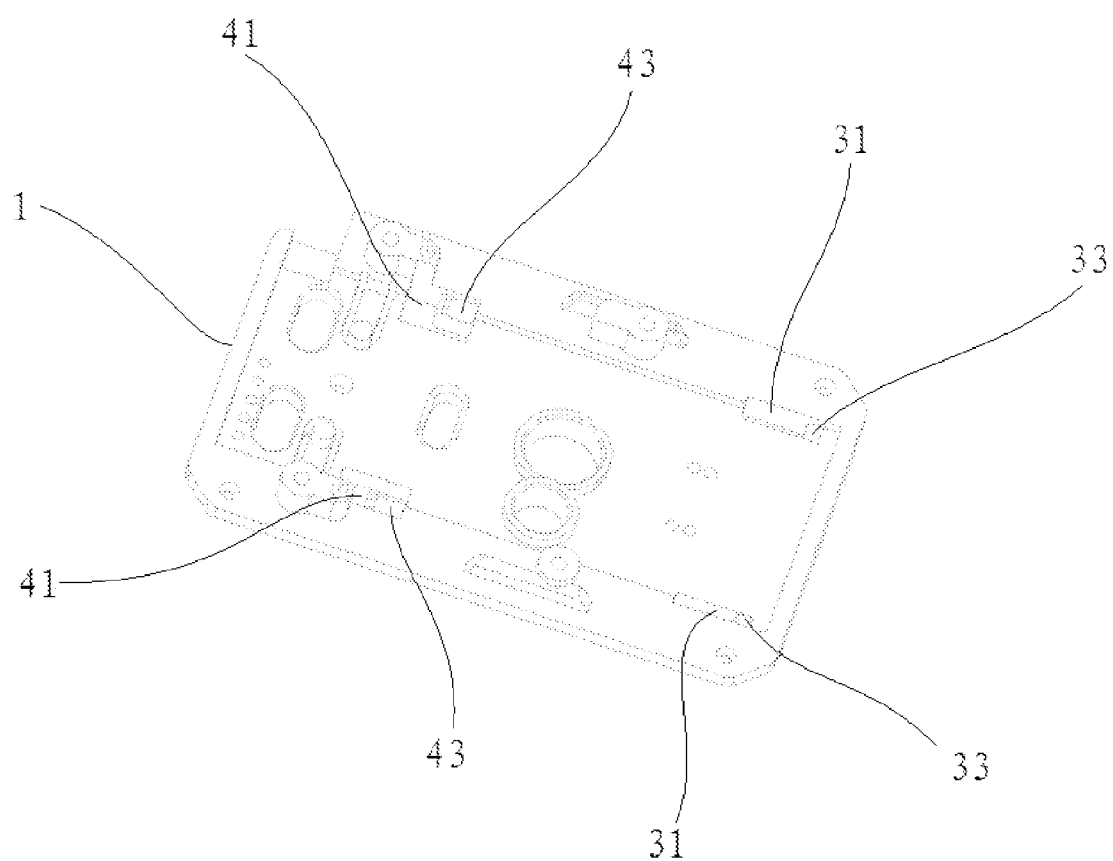
FIG. 3 is a three-dimensional diagram of a part of a replaceable structure disposed on a base according to Embodiment 1 of the disclosed embodiments.

Referring to FIG. 1 to FIG. 3, a replaceable panel structure of the disclosed embodiments comprises a base 1, and a panel body 2 mounted on the base 1 by using several snap structures in a replaceable manner, wherein: the snap structure comprises a slide slot and an engagement portion disposed on the base 1, and a slide fastener disposed on the panel body 2, the slide fastener is suitable to be inserted in the slide slot and slide back and forth in the slide slot to be engaged with or separated from the engagement portion, and the slide fasteners of the snap structures have consistent sliding directions in the slide slot. The disposition manners of the slide slot, the engagement portion and the slide fastener are not limited to this embodiment, and may also be that the slide slot and the engagement portion are disposed on the panel body 2, and the slide fastener is disposed on the base 1.

The replaceable panel structure of the disclosed embodiments is applied to the field of electrical components, the slide fastener disposed on the panel body 2 of an electrical component is inserted in the slide slot disposed on the base 1 of the electrical component, and slides back and forth in the slide slot to be engaged with or separated from the engagement portion, thereby implementing replacement of the panel of the electrical component.

The replaceable panel structure of the disclosed embodiments is not only simple in structure, but also can implement replacement of the panel by using sliding of the slide fastener along a direction perpendicular to an engagement direction of the panel and the base, so that the panel and the base of the electrical component are engaged stably, the process of removal during replacement is simple and convenient, and no damage is easily caused after multiple removals.

The specific forms of the slide slot, the engagement portion and the slide fastener may be various, and in this embodiment, the slide slot is a through slot formed on the base 1 or the panel body 2; one end portion of the slide slot forms the engagement portion.

The slide fastener comprises a longitudinal block and a horizontal block, one end of the longitudinal block is disposed on the panel body 2, and the other end is connected to one end of the horizontal block; the longitudinal block, the horizontal block and the panel body 2 enclose an embedding slot, and when the slide fastener moves toward the engagement direction, the embedding slot is suitable for embedding of the engagement portion.

Figure 4:
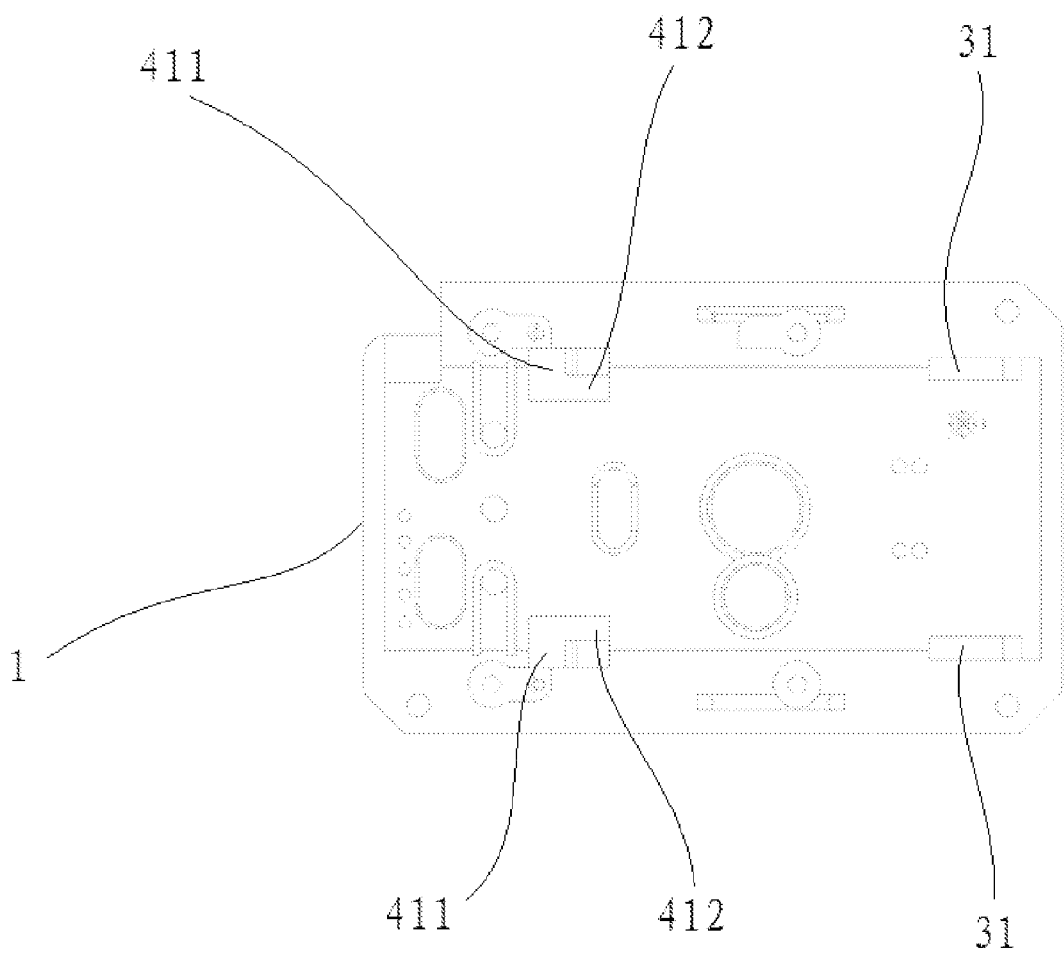
FIG. 4 is a top view of a part of a replaceable structure disposed on a base according to Embodiment 1 of the disclosed embodiments.

Referring to FIG. 2 to FIG. 4, in this embodiment, the snap structures comprise a first snap structure 3 and a second snap structure 4, wherein a first slide slot 31 of the first snap structure 3 is formed into a linear shape, a first slide fastener 32 comprises a first horizontal block 321 and a first longitudinal block 322, a length direction of the first horizontal block 321 is consistent with a length direction of the first slide slot 31, and a first engagement portion 33 is formed at one end portion of the first slide slot 31 facing the first embedding slot 100; a second slide slot 41 of the second snap structure 4 is formed into an L shape, and comprises a second horizontal slot portion 411 and a second vertical slot portion 412, wherein a second slide fastener 42 moves back and forth along the second vertical slot portion 412, a length direction of a second horizontal block 421 of the second slide fastener 42 is consistent with a length direction of the second horizontal slot portion 411 of the second slide slot 41, a second engagement portion 43 is formed at one end portion of the second vertical slot portion 412 facing the second embedding slot 200, and a length direction of the second engagement portion 43 is perpendicular to the length direction of the second horizontal slot portion 411. The dispositions of the first snap structure 3 and the second snap structure 4 enable that the panel body 2 and the base 1 are engaged in both the vertical direction and the horizontal direction, and therefore, the engagement is more stable and reliable.

There may be various specific matching manners between the first horizontal block 321 and the first engagement portion 33 and between the second horizontal block 421 and the second engagement portion 43. In this embodiment, an upper surface of the first horizontal block 321 and a lower surface of the first engagement portion 33 form matching wedge surfaces; an upper surface the second horizontal block 421 forms a convex cambered surface, and a lower surface of the second engagement portion 43 forms a matching concave cambered surface. The wedge surfaces enable more convenient and more reliable engagement of the first horizontal block 321 and the first engagement portion 33 during mounting of the panel. The upper surface of the second horizontal block 421 forms the convex cambered surface, and the lower surface of the second engagement portion 43 forms the matching concave cambered surface, such that after the second horizontal block 421 matches with the second engagement portion 43, it is not easily separated from the second engagement portion 43, thereby implementing more stable mounting of the panel on the base 1. During an actual application, the above matching manner may be changed according to different requirements, for example, the upper surface of the first horizontal block 321 also forms a convex cambered surface, and the lower surface of the first engagement portion 43 forms a matching concave cambered surface.

The numbers and specific disposition positions of the first snap structure 3 and the second snap structure 4 may have various selections in the application, and in this embodiment, preferably, two first snap structures 3 are provided and two second snap structures 4 are provided, which are respectively disposed at two ends of the panel body 2 or the base 1. Such a disposition enables more uniform forces applied to the panel body 2 and the base 1, and the replaceable panel is not easily separated after being mounted on the base 1, thereby having a good mounting effect.

Figure 5:
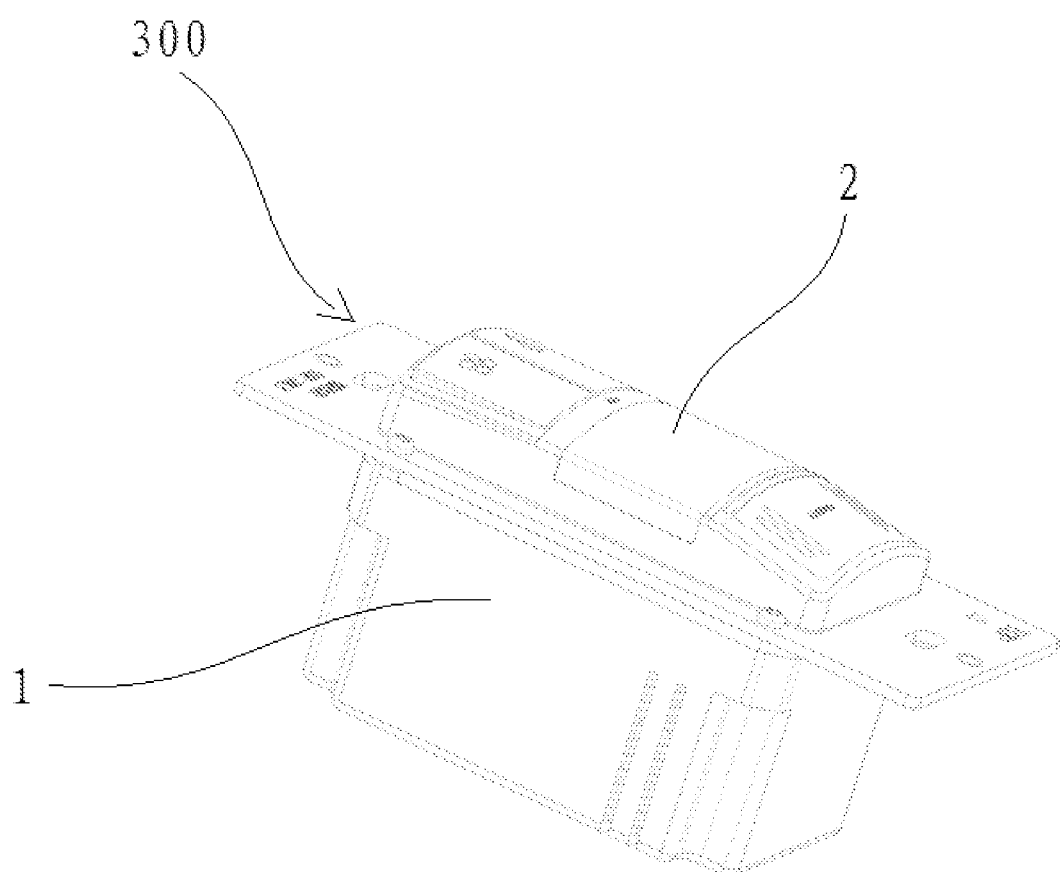
FIG. 5 is a three-dimensional diagram of a panel replaceable moisture sensor completing a panel mounting state according to Embodiment 4 of the disclosed embodiments.

Mounting and dismounting processes of the replaceable panel structure of the disclosed embodiments are described as follows:

During mounting, first the first slide fastener 32 and the second sliding block 42 are inserted into the first slide slot 31 and the second slide slot 41 along a direction perpendicular to a plane where the panel body 2 is located; then, the first slide fastener 32 and the second sliding block 42 are translated simultaneously in a direction parallel to the panel body 2 and respectively toward the first engagement portion 33 and the second engagement portion 43; and after the upper surface of the first horizontal block 321 and the upper surface of the second horizontal block 421 are in complete contact match with the lower surface of the first engagement portion 33 and the lower surface of the second engagement portion 43, the convex portion of the upper surface of the second horizontal block 421 completely enters the concave portion of the lower surface of the second engagement portion 43, the translation is stopped, thereby completing the mounting of the panel, as shown in FIG. 5.

During dismounting, first the first slide fastener 32 and the second sliding block 42 are translated simultaneously in a direction parallel to the panel body 2 and respectively away from the first engagement portion 33 and the second engagement portion 43; when the upper surface of the first horizontal block 321 and the upper surface of the second horizontal block 421 are respectively completely separated from the lower surface of the first engagement portion 33 and the lower surface of the second engagement portion 43, the translation is stopped; and then, the first slide fastener 32 and the second sliding block 42 are moved away from the first slide slot 31 and the second slide slot 41 respectively along a direction perpendicular to the plane where the panel body 2 is located, until they are completely separated from the base 1, thereby completing the dismounting of the panel, as shown in FIG. 1.

The specific form and number of the snap structures are not limited to this embodiment, for example, it is also available that there are merely four first snap structures 3 disposed between the panel body and the base, or there are merely four second snap structures 4 disposed between the panel body and the base.

Embodiment 2

A panel replaceable switch of this embodiment comprises the replaceable panel structure of Embodiment 1, and the panel body 2 is provided with a switch button.

Embodiment 3

A panel replaceable socket of this embodiment comprises the replaceable panel structure of Embodiment 1, and the panel body 2 is provided with a jack.

Embodiment 4

Referring to FIG. 5, a panel replaceable moisture sensor 300 of this embodiment comprises the replaceable panel structure of Embodiment 1, and the panel body 2 is provided with a function button of a sensor.

Apparently, the above embodiments are merely examples for clear descriptions, and are not intended to limit the implementation manners. For a person of ordinary skill in the art, variations or modifications in other different forms may also be made on the basis of the above descriptions. It is unnecessary to exhaust all implementation manners, and obvious variations or modifications derived therefrom still fall within the protection scope of the disclosed embodiments.

The invention claimed is:

1. A replaceable panel structure, comprising a base (1), and a panel body (2) mounted on the base (1) by using several snap structures in a replaceable manner, wherein: the snap structure comprises a slide slot and an engagement portion disposed on the base (1), and a slide fastener disposed on the panel body (2), the slide fastener is suitable to be inserted in the slide slot and slide back and forth in the slide slot to be engaged with or separated from the engagement portion, and the slide fasteners of the snap structures have consistent sliding directions in the slide slot; and wherein the slide slot is a through slot formed on the base (1); and
one end portion of the slide slot forms the engagement portion; and
the slide fastener comprises a longitudinal block and a horizontal block, one end of the longitudinal block is disposed on the panel body (2), and the other end is connected to one end of the horizontal block; the longitudinal block, the horizontal block and the panel body (2) enclose an embedding slot, and when the slide fastener moves toward an engagement direction, the embedding slot is suitable for embedding of the engagement portion.

2. The replaceable panel structure according to claim 1, wherein: the slide slot is formed into a linear shape, a length direction of the horizontal block of the slide fastener is consistent with a length direction of the slide slot, and the engagement portion is formed at one end portion of the slide slot facing the embedding slot.

3. The replaceable panel structure according to claim 1, wherein: an upper surface of the horizontal block and a lower surface of the engagement portion form matching wedge surfaces.

4. The replaceable panel structure according to claim 1, wherein: the slide slot is formed into an L shape, and comprises a vertical slot portion and a horizontal slot portion, the slide fastener moves back and forth along the vertical slot portion, a length direction of the horizontal block of the slide fastener is consistent with a length direction of the horizontal slot portion of the slide slot, and the engagement portion is formed at one end portion of the vertical slot portion facing the embedding slot.

5. The replaceable panel structure according to claim 1, wherein: the upper surface of the horizontal block forms a convex cambered surface, and the lower surface of the engagement portion forms a matching concave cambered surface.

6. The replaceable panel structure according to claim 1, wherein: the snap structures comprise a first snap structure (3) and a second snap structure (4), wherein a first slide slot (31) of the first snap structure (3) is formed into a linear shape, a first slide fastener (32) comprises a first horizontal block (321) and a first longitudinal block (322), a length direction of the first horizontal block (321) is consistent with a length direction of the first slide slot (31), and a first engagement portion (33) is formed at one end portion of the first slide slot (31) facing the first embedding slot (100); a second slide slot (41) of the second snap structure (4) is formed into an L shape, and comprises a second horizontal slot portion (411) and a second vertical slot portion (412), wherein a second slide fastener (42) moves back and forth along the second vertical slot portion (412), the second slide fastener (42) comprises a second horizontal block (421) and a second longitudinal block (422), a length direction of the second horizontal block (421) is consistent with a length direction of the second horizontal slot portion (411) of the second slide slot (41), a second engagement portion (43) is formed at one end portion of the second vertical slot portion (412) facing the second embedding slot (200), and a length direction of the second engagement portion (43) is perpendicular to the length direction of the second horizontal slot portion (411).

7. The replaceable panel structure according to claim 6, wherein: an upper surface of the first horizontal block (321) and a lower surface of the first engagement portion (33) form matching wedge surfaces; an upper surface the second horizontal block (421) forms a convex cambered surface, and a lower surface of the second engagement portion (43) forms a matching concave cambered surface.

8. The replaceable panel structure according to claim 7, wherein: two first snap structures (3) are provided, two second snap structures (4) are provided, which are respectively disposed at two ends of the panel body (2) and the base (1).

9. The replaceable panel structure of claim 1, wherein replacement of the panel body is through sliding of the slide fastener along a direction perpendicular to an engagement direction of the panel body and the base.

10. A panel replaceable switch, comprising a replaceable panel structure, the replaceable panel structure comprising:
a base (1), and a panel body (2) mounted on the base (1) by using several snap structures in a replaceable manner, wherein: the snap structure comprises a slide slot and an engagement portion disposed on the base (1), and a slide fastener disposed on the panel body (2), the slide fastener is suitable to be inserted in the slide slot and slide back and forth in the slide slot to be engaged with or separated from the engagement portion, and the slide fasteners of the snap structures have consistent sliding directions in the slide slot;
the slide slot is a through slot formed on the base (1); and one end portion of the slide slot forms the engagement portion;
the slide fastener comprises a longitudinal block and a horizontal block, one end of the longitudinal block is disposed on the panel body (2), and the other end is connected to one end of the horizontal block; the longitudinal block, the horizontal block and the panel body (2) enclose an embedding slot, and when the slide fastener moves toward an engagement direction, the embedding slot is suitable for embedding of the engagement portion; and
wherein the panel body (2) is provided with a switch button.

11. A panel replaceable socket, comprising a replaceable panel structure, the replaceable panel structure comprising:
a base (1), and a panel body (2) mounted on the base (1) by using several snap structures in a replaceable manner, wherein: the snap structure comprises a slide slot and an engagement portion disposed on the base (1), and a slide fastener disposed on the panel body (2), the slide fastener is suitable to be inserted in the slide slot and slide back and forth in the slide slot to be engaged with or separated from the engagement portion, and the slide fasteners of the snap structures have consistent sliding directions in the slide slot;
wherein
the slide slot is a through slot formed on the base (1); and one end portion of the slide slot forms the engagement portion; and
the slide fastener comprises a longitudinal block and a horizontal block, one end of the longitudinal block is disposed on the panel body (2), and the other end is connected to one end of the horizontal block; the longitudinal block, the horizontal block and the panel body (2) enclose an embedding slot, and when the slide fastener moves toward an engagement direction, the embedding slot is suitable for embedding of the engagement portion; and
wherein the panel body (2) is provided with a jack.

12. A panel replaceable moisture sensor, comprising a replaceable panel structure, the replaceable panel structure comprising:
a base (1), and a panel body (2) mounted on the base (1) by using several snap structures in a replaceable manner, wherein: the snap structure comprises a slide slot and an engagement portion disposed on the base (1), and a slide fastener disposed on the panel body (2), the slide fastener is suitable to be inserted in the slide slot and slide back and forth in the slide slot to be engaged with or separated from the engagement portion, and the slide fasteners of the snap structures have consistent sliding directions in the slide slot;
wherein the slide slot is a through slot formed on the base (1); and one end portion of the slide slot forms the engagement portion; and
the slide fastener comprises a longitudinal block and a horizontal block, one end of the longitudinal block is disposed on the panel body (2), and the other end is connected to one end of the horizontal block; the longitudinal block, the horizontal block and the panel body (2) enclose an embedding slot, and when the slide fastener moves toward an engagement direction, the embedding slot is suitable for embedding of the engagement portion; and
wherein the panel body (2) is provided with a function button of a sensor.

* * * * *